United States Patent

Gawhane

(10) Patent No.: US 10,677,742 B2
(45) Date of Patent: Jun. 9, 2020

(54) DETECTING DIE REPEATING PROGRAMMED DEFECTS LOCATED IN BACKGROUNDS WITH NON-REPEATING FEATURES

(71) Applicant: KLA-Tencor Corporation, Milpitas, CA (US)

(72) Inventor: Dhiraj Ramesh Gawhane, Navi Mumbai (IN)

(73) Assignee: KLA-Tencor Corp., Milpitas, CA (US)

( * ) Notice: Subject to any disclaimer, the term of this patent is extended or adjusted under 35 U.S.C. 154(b) by 0 days.

(21) Appl. No.: 16/295,999

(22) Filed: Mar. 7, 2019

(65) Prior Publication Data

US 2019/0277776 A1    Sep. 12, 2019

Related U.S. Application Data

(60) Provisional application No. 62/662,159, filed on Apr. 24, 2018.

(30) Foreign Application Priority Data

Mar. 9, 2018 (IN) .............................. 201841008780

(51) Int. Cl.
*G01N 21/95*    (2006.01)
*G01R 31/3185*    (2006.01)
(Continued)

(52) U.S. Cl.
CPC ..... *G01N 21/9501* (2013.01); *G01N 21/8851* (2013.01); *G01R 31/302* (2013.01);
(Continued)

(58) Field of Classification Search
CPC ....... G01N 21/9501; G01N 2021/8883; G01N 21/956; G01N 2021/8822; G01N 21/8851;
(Continued)

(56) References Cited

U.S. PATENT DOCUMENTS 9,008,410 B2    4/2015  Huang et al.
9,702,827 B1 *  7/2017  Brauer ............... G01N 21/8851
(Continued)

FOREIGN PATENT DOCUMENTS

WO    2017/117568    7/2017

OTHER PUBLICATIONS

International Search Report and Written Opinion for PCT/US2019/021405 dated Jun. 17, 2019.

*Primary Examiner* — Hina F Ayub
*Assistant Examiner* — Amanda Merlino
(74) *Attorney, Agent, or Firm* — Ann Marie Mewherter

(57) ABSTRACT

Systems and methods for detecting programmed defects on a wafer during inspection of the wafer are provided. One method includes selecting a mode of an inspection subsystem for detecting programmed defects on a wafer that generates output for the wafer having the lowest non-defect signal and at least a minimum signal for the programmed defects. The method also includes selecting a training care area that is mutually exclusive of care area(s) used for detecting the programmed defects during inspection of the wafer. The training care area generates less of the non-defect signal than the care area(s). The method further includes training a programmed defect detection method using the output generated with the selected mode in the training care area and detecting the programmed defects during the inspection of the wafer by applying the trained programmed defect detection method to the output generated in the care area(s) with the selected mode.

21 Claims, 4 Drawing Sheets

(51) Int. Cl.
*G01R 31/317* (2006.01)
*G01R 31/302* (2006.01)
*G01N 21/88* (2006.01)

(52) U.S. Cl.
CPC .................. *G01R 31/31728* (2013.01); *G01R 31/318544* (2013.01); *G01N 2021/8822* (2013.01)

(58) Field of Classification Search
CPC .............. G01R 31/2831; G01R 31/302; G01R 31/31728; G01R 31/318544
See application file for complete search history.

(56) References Cited

U.S. PATENT DOCUMENTS

| | | |
|---|---|---|
| 2007/0035725 A1 | 2/2007 | Takahashi et al. |
| 2011/0116085 A1 | 5/2011 | Lim et al. |
| 2015/0042978 A1 | 2/2015 | Lynch |
| 2017/0140524 A1 | 5/2017 | Karsenti et al. |

\* cited by examiner

DETECTING DIE REPEATING PROGRAMMED DEFECTS LOCATED IN BACKGROUNDS WITH NON-REPEATING FEATURES

BACKGROUND OF THE INVENTION

1. Field of the Invention

The present invention generally relates to systems and methods for detecting die repeating programmed defects located in backgrounds with non-repeating features. Certain embodiments relate to detection of such programmed defects during single die inspection (SDI) of a wafer with a dark field inspection tool.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

In the research and development environment of a foundry, there is increasingly a trend of having defects being programmed on the test vehicle chips. The reason for this approach is to understand the behavior of the defect based on the current process step and to have more accurate defect de-skew for scanning electron microscope (SEM) tools used for defect review. At smaller technology nodes, sometimes smaller SEM field of view (FOV) is required to view the defect of interest (DOI). Using a smaller FOV to re-detect a defect can be more easily and accurately achieved with better SEM de-skew and that is the main reason why foundry users want to detect these programmed defects on every inspection tool.

In general, therefore, detects are programmed on every die and are meant to be detected by every optical inspection tool to achieve accurate defect de-skew during SEM review. Defects could be programmed anywhere in a die even in an input/output region near the die corner, which might have substantially high scattering random (non-repeating) logic patterned features in the background. Some inspection tools may use an array algorithm for detection of such programmed defects. Inspection tools such as laser based tools can use different algorithms for detecting die repeater defects such as array mode and single die inspection (SDI) mode.

The currently used systems and methods may, however, have a number of disadvantages. For example, the defect detection modes described above may not be suitable for detecting defects in non-repeating logic regions. In particular, in older generations of laser based optical inspection tools, array mode was the only algorithm capable of detecting die repeater defects. A primary contingency for array mode to work is a well Fourier filtered (FF) array, i.e., all patterns eliminated from the images. The second contingency is a substantially quiet background. If there is any other noisy background, then directly implementing the older methods was not possible.

Accordingly, it would be advantageous to develop methods and systems for detecting programmed, die repeating defects in backgrounds containing non-repeating logic features that do not have one or more of the disadvantages described above.

SUMMARY OF THE INVENTION

The following description of various embodiments is not to be construed in any way as limiting the subject matter of the appended claims.

One embodiment relates to a system configured to detect programmed defects on a wafer during inspection of the wafer. The system includes an inspection subsystem configured for generating output for a wafer by scanning the wafer with light and detecting light scattered from the wafer during the scanning. The inspection subsystem is configured for generating the output with multiple modes defined by different values of at least one parameter of the inspection subsystem used for generating the output.

The system also includes one or more computer subsystems configured for selecting one of the multiple modes of the inspection subsystem for detecting programmed defects on the wafer by determining which of the multiple modes generates the output for the wafer having the lowest non-defect signal and at least a minimum signal for the programmed defects. The computer subsystem(s) are also configured for selecting a training care area. The training care area is mutually exclusive of one or more care areas used for detecting the programmed defects during inspection of the wafer. The training care area generates less of the non-defect signal than the one or more care areas used for detecting the programmed defects. In addition, the computer subsystem(s) are configured for training a programmed defect detection method using the output generated by the inspection subsystem with the selected one of the multiple modes in the training care area. The computer subsystem is further configured for detecting the programmed defects during the inspection of the wafer by applying the trained programmed defect detection method to the output generated in the one or more care areas by the inspection subsystem with the selected one of the multiple modes. The system may be further configured as described herein.

Another embodiment relates to a computer-implemented method for detecting programmed defects on a wafer during inspection of the wafer. The method includes the steps described above. The steps of the method are performed by one or more computer systems. Each of the steps of the method may be further performed as described further herein. In addition, the method may include any other step(s) of any other method(s) described herein. Furthermore, the method may be performed by any of the systems described herein.

Another embodiment relates to a non-transitory computer-readable medium storing program instructions executable on a computer system for performing a computer-implemented method for detecting programmed defects on a wafer during inspection of the wafer. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
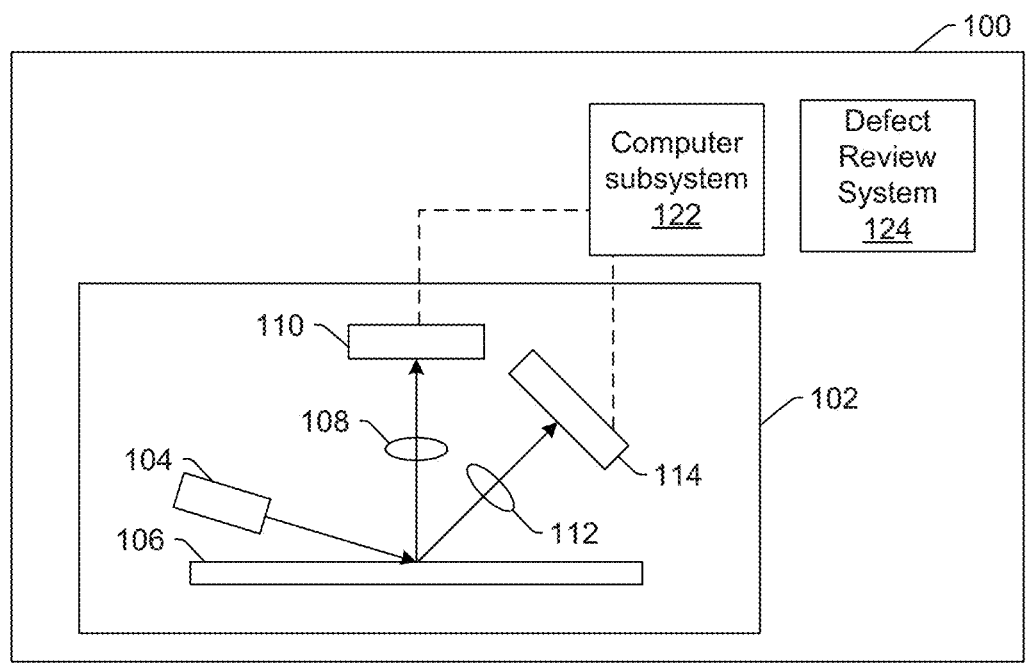
FIG. 1 is a schematic diagram illustrating a side view of an embodiment of a system configured as described herein.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein relate to a novel method for using a single die inspection (SDI) method for detecting die repeater defects in a non-repeating logic background on laser based dark field (DF) optical inspection tools. As described further herein, programmed defects may be located anywhere in a die, even in regions that have non-repeating, relatively high scattering patterned features such as non-repeating logic features. Therefore, the output, e.g., images, generated by DF tools for such programmed defects may be relatively noisy due to the non-repeating patterned features whose signals cannot be eliminated by currently available techniques such as Fourier filtering. The noise from the non-repeating patterned features is particularly problematic because older detection methods could only be used to detect die repeater defects located in a substantially quiet background or a background that is substantially well Fourier filtered. If there are die repeater defects in any other noisy background, then directly implementing the older detection methods is not possible. As such, programmed defects located in such backgrounds may not be detected by array modes on DF tools because the light scattering effects from the non-repeating features may not be adequately suppressed or removed by Fourier filtering or any other technique. However, SDI along with modifications to make the background of the programmed defects quieter (i.e., less noisy or with less non-defect signal) provides at least an option of working with vertical and horizontal non-repeating patterns. Therefore, the embodiments described herein were created for SDI of programmed defects in such backgrounds.

One embodiment relates to a system configured to detect programmed defects on a wafer during inspection of the wafer. One embodiment of such a system is shown in FIG. 1. As shown in FIG. 1, system 100 includes inspection subsystem 102 and computer subsystem 122. The inspection subsystem is configured for generating output for a wafer by scanning the wafer with light and detecting light scattered from the wafer during the scanning. For example, as shown in FIG. 1, the inspection subsystem includes light source 104. In one embodiment, the inspection subsystem includes a laser configured to generate the light used for scanning the wafer. For example, light source 104 may include any suitable laser known in the art. In this manner, the inspection subsystem may be a laser scanning optical system.

Light from the light source is directed to wafer 106 by the inspection subsystem. The light source may be coupled to any other one or more suitable elements (not shown) such as one or more condensing lenses, collimating lenses, relay lenses, objective lenses, apertures, spectral filters, polarizing components and the like. As shown in FIG. 1, the light may be directed to the wafer at an oblique angle of incidence. However, the light may be directed to the wafer at any suitable angle of incidence including near normal and normal incidence. In addition, the light (or multiple light beams) may be directed to the wafer at more than one angle of incidence sequentially or simultaneously.

The inspection subsystem may be configured to scan the light over the wafer in any suitable manner. For example, the inspection subsystem may include a scanning subsystem (not shown) configured to cause the light to be scanned over the wafer. In one such example, the inspection subsystem may include a stage on which wafer 106 is disposed during inspection. The scanning subsystem may include any suitable mechanical and/or robotic assembly (that includes a stage) that can be configured to move the wafer such that the light can be scanned over the wafer. In addition, or alternatively, the inspection subsystem may be configured such that one or more optical elements of the inspection subsystem perform some scanning of the light over the wafer. Scanning the wafer causes the illumination of the inspection subsystem to trace a path over the wafer as light scattered from the wafer is detected.

Light scattered from wafer 106 may be collected and detected by one or more of multiple channels of the inspection subsystem during scanning. For example, light scattered from wafer 106 at angles relatively close to normal may be collected by lens 108. Lens 108 may include a refractive optical element as shown in FIG. 1. In addition, lens 108 may include one or more refractive optical elements and/or one or more reflective optical elements. Light collected by lens 108 may be directed to detector 110. Detector 110 may include any suitable detector known in the art such as a charge coupled device (CCD) or another type of imaging detector. Detector 110 is configured to generate output that is responsive to the scattered light collected by lens 108. Therefore, lens 108 and detector 110 form one channel of the inspection subsystem. This channel of the inspection subsystem may include any other suitable optical components (not shown) known in the art such as a Fourier filtering component, a spectral filter, a polarizing component, and the like.

Light scattered from wafer 106 at different angles may be collected by lens 112. Lens 112 may be configured as described above. Light collected by lens 112 may be directed to detector 114, which may be configured as described above. Detector 114 is configured to generate output that is responsive to the scattered light that is collected by lens 112. Therefore, lens 112 and detector 114 may form another channel of the inspection subsystem. This channel may also include any other optical components (not shown) described above. In some embodiments, lens 112 may be configured to collect light scattered from the wafer at polar angles from about 20 degrees to about 70 degrees. In addition, lens 112 may be configured as a reflective optical component (not shown) that is configured to collect light scattered from the wafer at azimuthal angles of about 360 degrees.

The inspection subsystem shown in FIG. 1 may also include one or more other channels (not shown). For example, the inspection subsystem may include an additional channel, which may include any of the optical components described herein such as a lens and a detector, configured as a side channel. The lens and the detector may be further configured as described herein. In one such example, the side channel may be configured to collect and detect light that is scattered out of the plane of incidence (e.g., the side channel may include a lens, which is centered in a plane that is substantially perpendicular to the plane of incidence, and a detector configured to detect light collected by the lens).

The output generated by scanning the wafer may include any suitable output and may vary depending on the configuration of the inspection subsystem and/or the inspection recipe used to perform the scanning. For example, the output may include signals, data, images, or image data responsive to light scattered from the wafer (e.g., in the case of DF inspection systems).

Output generated by the detector(s) during scanning may be provided to computer subsystem 122. The computer subsystem may be coupled to each of the detectors in any suitable manner. For example, the computer subsystem may be coupled to each of the detectors (e.g., by one or more transmission media shown by the dashed lines in FIG. 1, which may include any suitable transmission media known in the art) such that the computer subsystem may receive the output generated by the detectors. The output generated by the detectors during scanning of the wafer may include any of the output described herein. The inspection subsystem may be configured for DF inspection, possibly in combination with one or more other inspection modes (e.g., an aperture mode of inspection).

Computer subsystem 122 may be configured to perform a number of functions using the output of the detector(s) as described herein and any other functions described further herein. This computer subsystem may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem (not shown), the different computer subsystems may be coupled to each other such that images, data, information, instructions, etc. can be sent between the computer subsystems. For example, different computer subsystems may be coupled to each other by any suitable transmission media, which may include any suitable wired and/or wireless transmission media known in the art. Two or more of such computer subsystems may also be effectively coupled by a shared computer-readable storage medium (not shown).

The inspection subsystem is configured for generating the output, e.g., images, with multiple modes defined by different values of at least one parameter of the inspection subsystem used for generating the output. In general, a "mode" is defined by the values of parameters of the inspection subsystem used for generating images of a wafer (or the output used to generate images of the wafer). Therefore, modes that are different may be different in the values for at least one of the parameters of the inspection subsystem.

The different modes may use different illumination parameters such as different wavelengths, angles of incidence, polarizations, etc., or some combination thereof of light for illumination. The modes may be different in the illumination parameter(s) in any suitable manner, e.g., by using different light sources or different illumination channels, different spectral filters, different polarizing components, etc. for different modes. The modes may also or alternatively be different in any one or more alterable parameters of collection/detection, e.g., angles, wavelengths, polarizations, etc. of collection/detection. The modes may be different in the collection/detection parameters in any suitable manner (e.g., by changing polarization components positioned in the path of the collected/detected scattered light). The modes may also be different in any other one or more alterable parameters of the inspection subsystem.

It is noted that FIG. 1 is provided herein to generally illustrate a configuration of an inspection subsystem that may be included in the system embodiments described herein. Obviously, the inspection subsystem configuration described herein may be altered to optimize the performance of the inspection subsystem as is normally performed when designing a commercial inspection system. In addition, the systems described herein may be implemented using an existing inspection system (e.g., by adding functionality described herein to an existing inspection system) such as the Puma 9xxx series of tools that are commercially available from KLA-Tencor, Milpitas, Calif. For some such systems, the methods described herein may be provided as optional functionality of the system (e.g., in addition to other functionality of the system). Alternatively, the system described herein may be designed "from scratch" to provide a completely new system.

In an embodiment, the programmed defect detection method performed by the computer subsystem includes a single die inspection (SDI) method. In general, SDI includes generating first image data for the wafer using the output and a first cell size and second image data for the wafer using the output and a second cell size. In this manner, unlike common multiple die (or die-to-die) inspection approaches in which the reference images are from adjacent dies, SDI applies reference pixels from the same die but different cells. The first and second cell sizes may be determined as described further herein.

SDI also includes combining the first image data and the second image data corresponding to substantially the same locations on the wafer thereby creating additional image data for the wafer. In this manner, the first and second image data may be combined on a location-to-location basis. Combining the first image data and the second image data creates different image data for the wafer, which can then be used as described further herein (e.g., for defect detection). For example, combining the first and second image data may include performing "image fusion" using the first and second image data. In other words, new image data of the wafer may be "fused" from two other image data of the wafer. In addition, since the first and second image data are generated for cells having different cell sizes, the fusing step described herein may be referred to as "cell fusion." In SDI, defect detection is not performed prior to the combining step.

SDI is particularly useful for combining first and second image data generated for a region of a die on the wafer containing repeating patterned features that are visible in the output. For example, unlike an array region, in the periphery region with repeating patterned features, the cell can be seen as the repeating pattern. Therefore, SDI as described herein may be performed in a periphery, or other non-array, region of dies formed on a wafer having a repeating pattern.

SDI further includes detecting defects on the wafer using the additional image data. The defects detected on the wafer using the additional image data may include any defects known in the art and may vary depending on one or more characteristics of the wafer (e.g., the wafer layer or the process performed on the wafer prior to inspection). Detecting the defects using the additional image data may include applying one or more defect detection thresholds to the additional image data. For example, the additional image data may be compared to one or more defect detection thresholds. The one or more defect detection thresholds can be used to make a decision regarding whether a pixel in the additional image data is defective or not.

One or more defect detection thresholds that are used to detect the defects on the wafer may be defect detection threshold(s) of one or more defect detection algorithms, which may be included in an inspection recipe. The one or more defect detection algorithms that are applied to the additional image data may include any suitable defect detection algorithm(s) and may vary depending on, for example, the type of inspection that is being performed on the wafer. Examples of suitable defect detection algorithms, which can be applied to the additional image data, include segmented auto-thresholding (SAT) and multiple die auto-thresholding (MDAT), which are used by commercially available inspection systems such as those from KLA-Tencor. In this manner, the additional image data may be treated as any other image data when it comes to defect detection.

SDI is generally performed with one or more care area groups (CAGs). During SDI setup, the system may automatically place image boxes for SDI and show the image boxes to a user in a CA die view. The system may then grab and measure cell size by grabbing images at the image box locations.

By combining (or fusing) information at the pixel level in SDI, weak signal strengths from defects of interest (DOI) may be enhanced because the noise is greatly suppressed. For example, fusing information at the pixel level thereby leveraging both magnitude (intensity) and phase (correlation) information enables extraction of defects with weak signals by suppressing noise and nuisance events through exploitation of their respective coincidence and non-coincidence. In this manner, one advantage of SDI is that pattern noise can be greatly reduced in the additional image data compared to the first and second image data while defect signal-to-noise ratios (S/Ns) in the additional image data are improved compared to the first and second image data. As such, a defect that is not detectable in either of the first or second image data may become detectable in the corresponding additional image data created by image correlation. In this manner, SDI may be used to enhance the detectability of DOI for wafer inspection systems.

SDI is, therefore, substantially different than other DF inspection methods. For example, in some DF inspection methods, existing array mode algorithms may be used for inspection of one die. However, DF array modes are limited to relatively quiet array regions and the local intensity comparison is limited to a fixed 5 pixel×5 pixel neighborhood. In contrast, as described herein, SDI may be used in relatively quiet array regions and the cell size may be selected based on the wafer being inspected and the defects that will be detected thereon. For example, the cell size may be selected based on the distance between repeating defects that are on the wafer such that the cell size that is used enables detection of those repeating defects. In addition, the cell sizes used for comparisons in the array regions are not fixed and can be determined on a wafer-to-wafer basis as described herein (e.g., based on the distance between adjacent repeating defects in the array region). Therefore, SDI is advantageously adaptable to many different wafers and repeating defects.

The SDI method performed by the embodiments described herein may further be performed as described in U.S. Pat. No. 9,008,410 to Huang et al, issued on Apr. 14, 2015, which is incorporated by reference as if fully set forth herein. The embodiments described herein may be further configured as described in this patent.

In another embodiment, the programmed defects include die repeater defects in a region of a die on the wafer, and the region includes non-repeating logic patterned features. The programmed defects may include "repeaters" or "repeating defects," in that the programmed defects repeat at the same or substantially the same location in multiple dies (or every die) on the wafer. Examples of non-programmed defects that are die repeaters include detects caused by an unintended defect on a mask or reticle used to print multiple instances of a design on a wafer. However, a defect may be programmed on the mask or reticle intentionally, for example, to study a process step and as described further herein for substantially accurate scanning electron microscope (SEM) de-skew. If the programmed defects are repeaters existing at corresponding locations in all dies, then the defects will be missed by die-to-die subtraction. However, if the cell size is set as described above, then all detects, including repeating detects, beyond the noise floor (i.e., all defects having signals greater than the noise floor) can be caught by the embodiments described herein.

The programmed defects may be created intentionally by altering or creating a design for the wafer, e.g., using an electronic design automation (EDA) tool to modify the design data (e.g., computer aided design (CAD)) for the design. The altered or created design can be printed on a reticle or mask, which can then be used to transfer the design to a wafer via a lithography process. The reticle or mask may be created in any suitable manner with the design containing the programmed defects. The reticle or mask may include any suitable reticle or mask known in the art. The lithography process may be performed in any suitable manner known in the art, and the wafer may include any suitable wafer known in the art.

Figure 2:
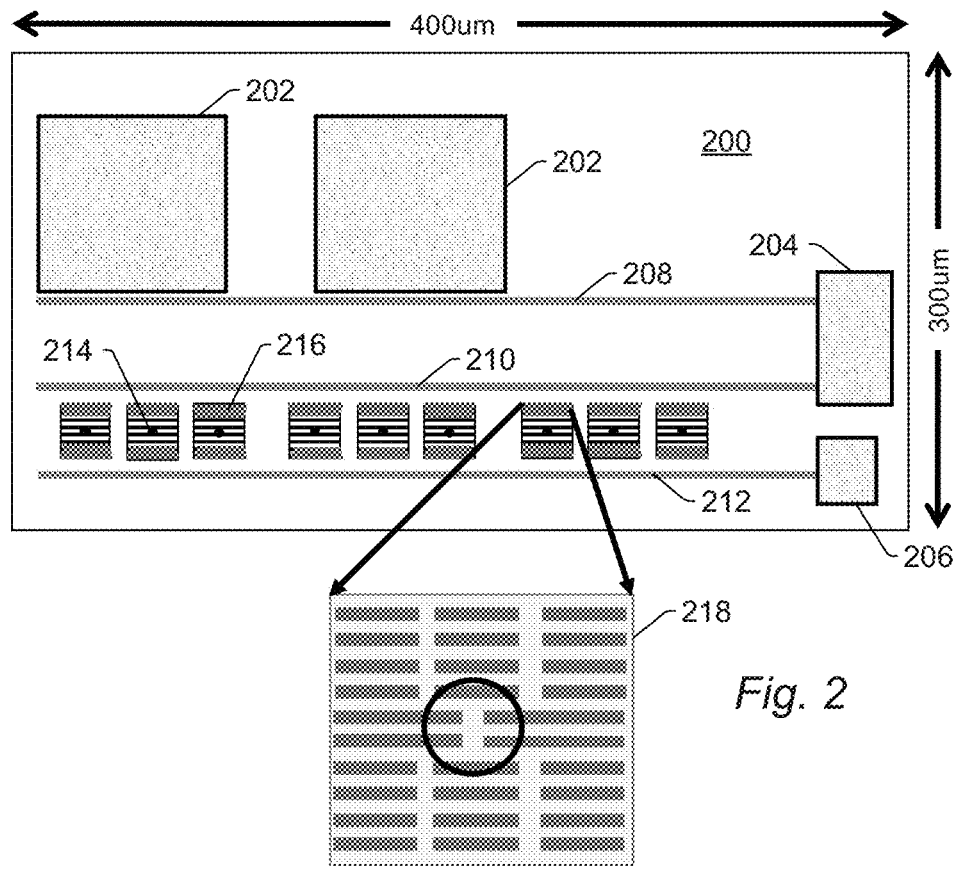
FIG. 2 is a schematic diagram illustrating a plan view of one embodiment of programmed defects in a region of a die on a wafer and an example scanning electron microscope (SEM) image generated for one of the programmed defects.

FIG. 2 shows a rough schematic of one embodiment of the location of programmed defects in a region of a die on a wafer. As shown in FIG. 2, region 200 of a die on a wafer may include a number of components including logic blocks 202, blocks 204 and 206, bus 208, bus 210, and bus 212. Blocks 204 and 206 may include any suitable device blocks such as input blocks, output blocks, controllers, power devices, buffers, and the like containing any suitable device patterned features. In some embodiments, the programmed defects are located in an input/output (I/O) region in a die formed on the wafer. For example, the blocks shown in FIG. 2 may contain I/O devices and patterned features in an I/O region near the die corner, which might have substantially high scattering random (non-repeating) patterned features. The region of the die in which the programmed defects are located may, however, have any suitable configuration known in the art. As further shown in FIG. 2, the die area in which the programmed defects may be located is a relatively sparse region (i.e., there are relatively large areas that do not contain any patterned features).

As further shown in FIG. 2, there may be 9 programmed defects 214, each located in its own defect cell 216. The programmed defect cells may take up a relatively small area in the region. For example, the region shown in FIG. 2 may have dimensions of about 400 microns by about 300 microns while the defect cells may have dimensions of about 9 microns wide by 8 microns high. The spacing between adjacent defect cells may be about 5 microns. The programmed defects may have a size of about 0.25 microns. The above dimensions may however be tailored based on the design of the die on the wafer. In other words, the embodiments described herein are not limited to any particular design of the die and the programmed defects. In addition, although each of the programmed defects are shown as having the same shape and size, some of the programmed defects may have different shapes, dimensions, or any other characteristics from each other. In this manner, the programmed defects for which the steps described herein are performed may have any characteristics and any location in the dies although the embodiments described herein are particularly advantageous for programmed defects whose background (i.e., a relatively small area surrounding the defects on the order of less than a few tens of microns) contains non-repeating patterned features.

In some embodiments, each of the one or more care areas includes multiple defect cells, and each of the multiple defect cells includes at least one of the programmed defects. The 9 defects cells shown in FIG. 2 may be arranged in 3 groups of 3, and care areas may be drawn covering the defect cells in the groups of 3 cells. In other words, for the 9 programmed defect cells, 3 care areas are drawn in total, with each care area covering 3 programmed defect cells. Each of the care areas contains mutually exclusive areas on the wafer. In other words, none of the care areas for the programmed defects overlap with one another on the wafer. In this way, since all 9 programmed defects will typically be detected during inspection, the care areas are drawn in such a way that all 9 defects are covered.

Image 218 shown in FIG. 2 represents an example of what a SEM image might look like for one of the programmed defects. The SEM image may be taken with a relatively small FOV (e.g., about 1 micron).

Figure 3:
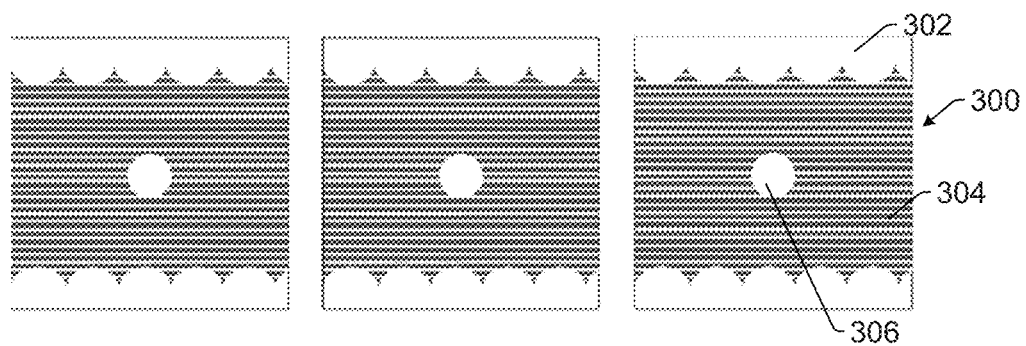
FIG. 3 is a schematic diagram illustrating one example of images generated for a subset of the cells in which the programmed defects shown in FIG. 2 are located and the effect of Fourier filtering on the images.
Figure 3:
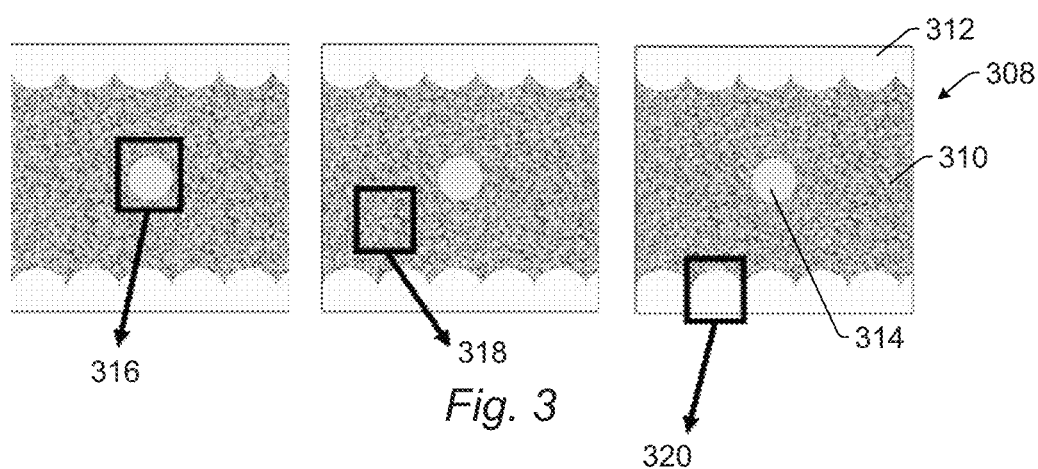

In some embodiments, the programmed defects are located in a region of a die on the wafer, and the region includes patterned features that cause the output generated in the one or more care areas to contain non-defect signals that cannot be eliminated by Fourier filtering. For example, FIG. 3 illustrates the effect of Fourier filtering on the programmed defect cells shown in FIG. 2. (Although only a subset of the programmed defect cells of FIG. 2 are shown in FIG. 3, this behavior will be exhibited by all of the defect cells if they all have the same design as is expected.) As shown in FIG. 3, prior to Fourier filtering, images 300 of the programmed defect cells include bright scatter 302 at the top and bottom edges of the images due to non-repeating patterned features in the defect cells, bright scatter 304 due to repeating patterned features in the defect cells, and scatter 306 due to the programmed defect itself. As shown in post-Fourier filtering images 308 corresponding to pre-Fourier filtering images 300, the bright scatter due to the repeating patterned features will be completely eliminated by the Fourier filtering leaving only background noise 310 in its place. However, the post-Fourier filtering images will still include at least some of bright scatter 312 from the non-repeating patterned features near the top and bottom edges of the programmed defect cell and bright scatter 314 from the programmed defect. As such, the non-defect signals generated by the programmed defect cells cannot be Fourier filtered completely since the bright scatter near the edges will remain post-Fourier filtering. By analyzing the post-Fourier filtering output from the defect cells, it is clear that an array mode defect detection algorithm cannot be used to detect such programmed defects for the reasons described further herein.

The SDI method is CAG based. In this manner, a training box/CAG is needed for SDI training. As described further herein, in some embodiments, the programmed defects are located in a region of a die on the wafer, and the region includes patterned features that cause the output generated in the one or more care areas to contain non-defect signals that cannot be eliminated by Fourier filtering. In one such embodiment, the programmed defect detection method includes an SDI method, and a size of an area in the region that does not generate the non-defect signals is smaller than a minimum, predetermined size of an area required for training the SDI method. For example, if the output generated for the programmed defects with the best mode in terms of signal value for the programmed defects contains non-defect signals such as those shown in FIG. 3, then training the SDI method using that output can be problematic. In particular, the non-defect signals in the output can reduce the area in the output that is suitable for training the SDI method to below the area required for training the SDI method. In other words, the training area required for the SDI training has a minimum size. If an area having a size equal to or greater than the minimum size is not available, then the SDI method will not allow training to proceed. Since, as described further herein, the SDI training box cannot be drawn anywhere near the defect cells, the minimum size limit of the SDI training box cannot be met.

The SDI training area must also be selected to have suitable characteristics. For example, if the training area contains non-defect signals (such as the relatively bright scattering from the non-repeating logic patterned features in the programmed defect cells), then the SDI method may determine that the training area does not fall into any available SDI category after SDI training. The available categories include array, horizontal, and vertical (where "array" generally refers to patterns that repeat in two dimensions while "horizontal" and "vertical" refer to patterns that repeat in only one dimension such as page breaks). If the training area contains a bulk pattern or non-scattering region, then the SDI training will determine that the training area falls into one of the array, vertical, or horizontal categories. If the training area includes non-repeating, non-defect signals post-Fourier filtering, then the SDI training will determine that the area falls into the random category (meaning that the SDI training cannot determine the cell size). For example, if the training area includes no bulk pattern with heavy scatter from edges, then the SDI training will classify the training area as random. It is a feature of the SDI method that if a training area falls into the random category, the SDI method cannot be used for that area. In other words, if the training result is one of array, horizontal, and vertical, then SDI can be used without any issues. However, if the training result is random, then the SDI software will not allow SDI to be used because after training it could not measure the required parameters.

Figure 4:
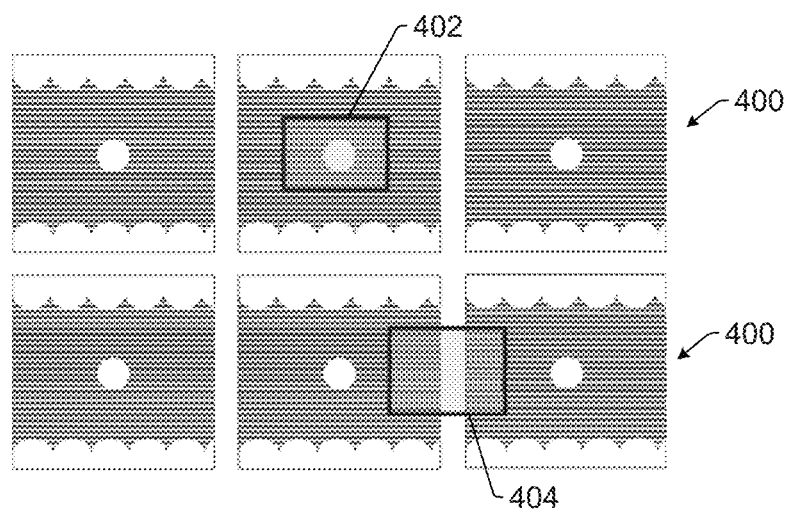
FIG. 4 is a schematic diagram illustrating the pre-Fourier filtering images of FIG. 3 with examples of the maximum size of a training care area available at different areas within the cells in which the programmed defects are located.

FIG. 4 illustrates the limitations of using the areas within the programmed defect cells for training the SDI method. For example, FIG. 4 illustrates pre-Fourier filtering images 400 for different subsets of the programmed defect cells shown in FIG. 2 (images for fewer than all of the programmed defect cells are shown in FIG. 4 only for the sake of simplicity). Although the limitations of the available training area within the programmed defect cells are shown in FIG. 4 in pre-Fourier filtering images, the same limitations will be true for the post-Fourier filtering images.

There are multiple options for a training area in the programmed defect cell images. One training area 402 is centered (at least roughly) on the programmed defect location and has dimensions that are smaller than the entire programmed defect cell to avoid including the relatively bright scatter from the non-repeating patterned features near the top and bottom edges of the cell in the training area. Since such a training area will include only repeating non-defect signals, the training area will be classified as an array area, which is a valid training result for the SDI method. Another option is training area 404 that is centered (at least roughly) on the space between the programmed defect cells and has dimensions that prevent the relatively bright scatter from the non-repeating patterned features near the top and bottom edges of the cell (and from the programmed defects) from being included in the training area. Since such a training area will also include only repeating non-defect signals, this training area will also be classified as an array area, which is a valid training result for the SDI method.

Although training areas that will produce a valid training result can be found in the programmed defect cells, the available training areas do not have a size that is equal to or greater than the minimum size required by the SDI method for the training area (e.g., about 12 microns). In this manner, a suitable training care area cannot be drawn within the programmed defect cells because a minimum training care area size limit cannot be met by the available areas that can be used for training.

Figure 5:
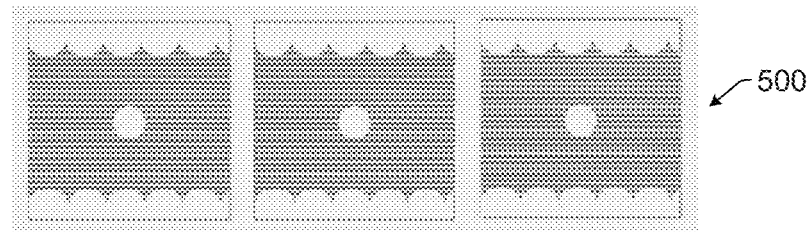
FIG. 5 is a schematic diagram illustrating the pre-Fourier filtering images of FIG. 3 with an example of the minimum size of a training care area needed for training a defect detection method overlaid thereon.

In another embodiment, the programmed defects are located in different defect cells, respectively, and a size of the different defect cells is smaller than a minimum, predetermined size of an area required for training the programmed defect detection method thereby preventing any of the different defect cells from being used as the training care area. In other words, the size of each of the programmed defect cells is smaller than the required size for the training care area meaning that none of the programmed defect cells are in of themselves large enough to be used as the training care area. If the size of the training care area is increased to cover one or more entire programmed defect cells (e.g., a group of 3 programmed defect cells) in order to meet the minimum training care area size limit, then the SDI training will produce a "random" result, which is not a valid result (meaning the SDI training cannot be successfully completed thereby preventing the SDI from being performed in the area). For example, FIG. 5 shows the pre-Fourier filtering images of FIG. 3 with an example of the minimum size of training care area 500 needed for training SDI overlaid with a subset of the cells in which the programmed defects are located. As shown in FIG. 5, selecting the training care area in the programmed defect cells based on the minimum possible size results in the training care area including non-defect signals from non-repeating patterned features. As such, the SDI training will classify such a training care area as a random area thereby preventing the SDI training from being successfully completed.

To address the above limitations in the training of the SDI method, e.g., to get a valid training result (i.e., to avoid getting "random" as a training result), the inventor has discovered that it is best to find and use another location for SDI training. To use SDI, the background of the other location should be substantially similar to the defects cells containing the programmed defects. So horizontal and vertical SDI is not going to work because the programmed defect cells do not include patterned features that repeat in one dimension. Instead, the inventor has found a way to "force" the SDI training to classify the training care area as an array type area. In addition, to address the above limitations of SDI training, the inventor has discovered that the optical mode used for training (and for detecting the programmed defects) can be selected to suppress relatively bright scatter from the edges of the defect cells to a degree that makes using SDI detection possible for the programmed defect cells.

Solving the relatively bright scatter issue was tackled optically first. To eliminate relatively bright scatter from the non-repeating patterned features, valid Fourier filtering results for different illumination angle tests (e.g., oblique incidence and normal incidence) were already available. However, the Fourier filtered trained images were substantially noisy. So using a different mode for programmed defect detection was explored as one of the possibilities to suppress relatively bright scatter.

The computer subsystem(s) are configured for selecting one of the multiple modes of the inspection subsystem for detecting programmed defects on the wafer by determining which of the multiple modes generates the output for the wafer having the lowest non-defect signal and at least a minimum signal for the programmed defects. For example, tests can be created for the different incidence angles described above for every optics combination with manual light level adjustments by checking the images generated for these optics combinations. Since the goal is to remove the relatively bright scatter, visual analysis and judgment may be substantially important.

In one embodiment, selecting the one of the multiple modes includes generating the output for the wafer in only one or more cells in which the programmed defects are located, and determining which of the multiple modes generates the output for the wafer having the lowest non-defect signal and at least the minimum signal for the programmed defects is performed based on only the output generated in only the one or more cells in which the programmed defects are located. For example, unlike selecting optical mode(s) for non-programmed defect detection (or "normal" inspection) in which a relatively large area on the wafer may be scanned, the mode selection step may include selective scanning of only the programmed defect cells. In particular, the programmed defect detection may be only one part (or test) of the inspection of the wafer, and other tests may be performed in the inspection, e.g., to detect non-programmed defects and/or for any other reason. Therefore, the scanning performed on the wafer to generate output for the mode selection step does not need to be performed in any part of the wafer other than the programmed defect cells. As such, the mode selection step may be different in this respect compared to mode selection performed for typical wafer inspection.

Figure 6:
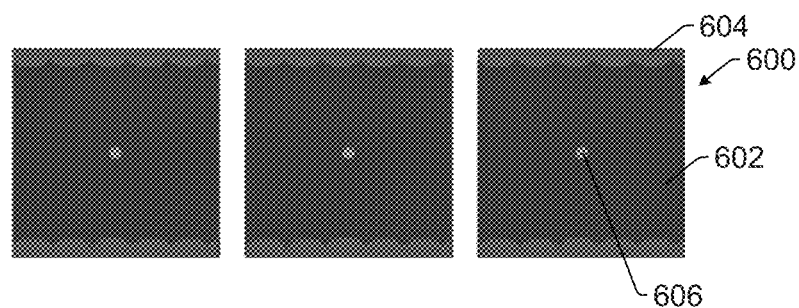
FIG. 6 is a schematic diagram illustrating one example of images generated for a subset of the cells in which the programmed defects shown in FIG. 2 are located with a mode of the inspection subsystem selected as described herein.

For one wafer layer, after verifying all of the optics modes, NISPPP (which stands for normal incidence, s-polarized illumination, and p-polarized detection in three detection channels) with Fourier filtering was found to be the best mode that had maximum suppression of noisy scatter (i.e., best background scatter) and also the defect signal was higher than its background as shown in FIG. 6. For example, as shown in images 600 for a subset of the programmed defect cells, the selected mode produced virtually no signal in central background 602 of the defect cells where the repeating patterned feature light scattering signals were previously. While the selected mode still produced some non-defect light scattering signals 604 at the edges of the images due to the non-repeating patterned features, those non-defect signals were substantially reduced compared to the those produced in the previously used mode.

Although the selected mode resulted in a lower defect signal 606 than the defect signal produced in the previously used mode, the selected mode only has to produce some defect signal (i.e., a non-zero defect signal or a defect signal not equal to or lower than the noise floor) in order for the programmed defect to be detectable by the SDI method. NISPPP with Fourier filtering has the minimum defect signal value but SDI is very powerful in detecting significantly weak signal defects and so the existing SDI method with such optics tuning would detect these programmed defects.

Since the previously bright, non-repeating patterned feature scattering region in the images is significantly quiet in the NISPPP mode, the defect cell images are substantially quiet thereby allowing array type SDI to be used with a suitable threshold (e.g., about 40). For example, different portions of the images have different ranges of signal values. In particular, as shown in FIG. 3, defect portion 316 will have a first range of signal values, background portion 318 will have a second range of signal values, and non-repeating pattern portion 320 will have a third range of signal values. If the background portion has a signal of about 25, the non-repeating pattern portion has a signal of about 35, and the defect portion has a signal of about 60, then the SDI threshold can be set at about 40 to avoid detection of the background and non-repeating pattern portions as defects while allowing the defect portion to be detected as a defect. Even though a mode has been found that can be used for programmed defect detection, it is still necessary to figure out how to train SDI for the programmed defect cells.

In this manner, the mode selection performed by the embodiments described herein is a kind of "optics tuning" and one of multiple knobs that can be used during SDI training especially if the programmed defects are in a region with random non-repeating patterns. In essence, optics tuning in SDI can be performed in a manner similar to currently used optical mode determination methods and systems. For example, output can be generated for the programmed defect cells with each of the modes available on the inspection subsystem (or some selected portion of all of the available modes), and the characteristics of the output can be compared to determine which of the modes produced the best output for the programmed defect cells (wherein the "best" output may be defined as having minimum scattering signals for the non-repeating and repeating patterned features with at least some programmed defect signal). The steps performed for mode selection (e.g., the scanning and output comparisons) can be performed completely manually and/or with some user input.

In this manner, when an initial SDI training result is "random," the mode selection can be performed to make the background as quiet as possible even if the programmed defect signal drops significantly (as long as it is at least somewhat higher than the background). Since the background can be made substantially quiet as described herein, only one type of SDI can be selected in training and used for the programmed defect detection, namely that is array type SDI. The CAG may be modified as described further herein so that the SDI training result is array.

In one embodiment, the inspection of the wafer includes detecting non-programmed defects on the wafer, and the output generated by the inspection subsystem used for detecting the non-programmed defects on the wafer includes output generated for the wafer by the inspection subsystem with another of the multiple modes different from the selected one of the multiple modes. For example, the programmed defect detection may be just one part of an entire inspection process performed for the wafer. The entire inspection process may use different modes for different parts, one mode for programmed defect detection and another mode for other defect detection. The modes used for programmed and other defect detection may be different in any parameters of the inspection subsystem including those described further herein. In some instances, the different modes can be used to scan the wafer at the same time (e.g., where one mode uses one detection channel and another mode uses another detection channel but both modes use all of the same other parameters of the inspection subsystem). However, different modes may be used in different scans of the wafer with changes to one or more parameters of the inspection subsystem between the different scans. Since the different modes may be used for different tests, the different modes may also scan different areas on the wafer. In this manner, the different modes may be used with different scanning parameters.

The computer subsystem(s) are also configured for selecting a training care area. The training care area is mutually exclusive of one or more care areas used for detecting the programmed defects during inspection of the wafer. The training care area generates less of the non-defect signal than the one or more care areas used for detecting the programmed defects. In one embodiment, selecting the training care area is performed based on the output generated by the inspection subsystem using the selected one of the multiple modes. For example, after selecting a mode as described above, the next step is to find a way to train SDI to get a valid SDI training result. As mentioned above, SDI is a CAG based method and now our requirement to proceed with SDI has become limited by the results of the mode selection step, i.e., we can only have an SDI training result that is determined to be the "array" type. The inventor has found that it is possible to find an area near the programmed defect cells that has a substantially quiet background, and the CAG can be modified to include that region into the CAG of programmed defect cells and this newly included area can be used only for SDI training. Even if it is not possible to find any region with a substantially quiet background, it is possible to include a very well Fourier filtered SRAM region just for the purpose of SDI training. After training SDI in this newly included CA, the SDI training result that was categorized as random may instead be categorized as array. Then, the system can proceed with SDI training for the detection of programmed defects.

Figure 7:
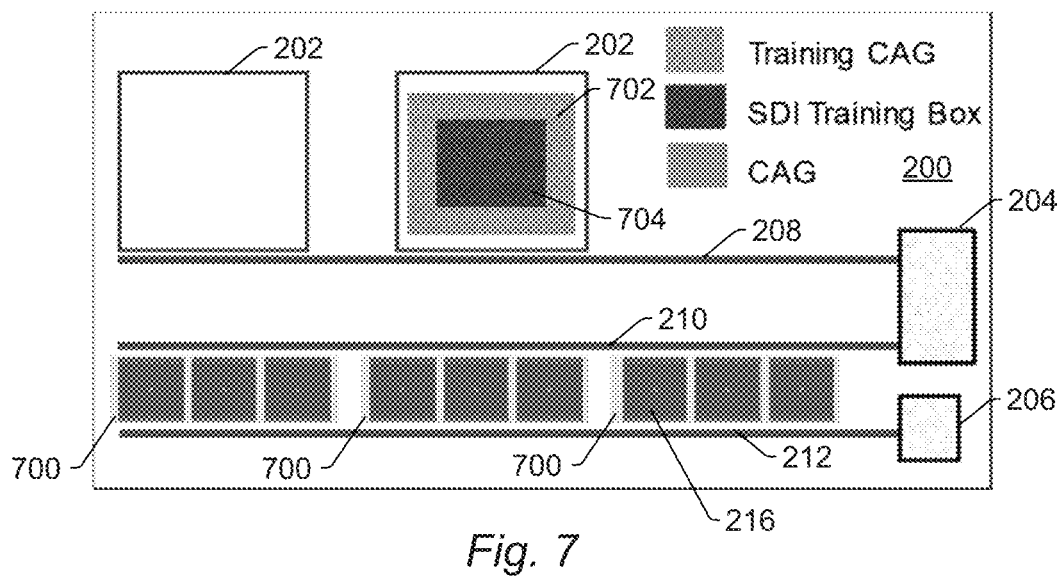
FIG. 7 is a schematic diagram illustrating a plan view of the embodiment of the programmed defects shown in FIG. 2 with one embodiment of a training care area and one or more care areas selected as described herein.

FIG. 7 shows the programmed defect cells in the region of the die of FIG. 2 with one embodiment of a training care area and one or more care areas selected as described herein. For example, as shown in FIG. 7, care areas 700 used for programmed defect detection may include 3 separate care areas, each including 3 of the programmed defect cells. Training care area 702 may be selected in logic block 202. As shown in FIG. 7, the training care area and the one or more care areas used for programmed defect detection are mutually exclusive areas in the region of the die on the wafer. In other words, the training care area and the one or more care areas do not overlap at all on the wafer and are spaced apart on the wafer. This training care area may be selected as described further herein (e.g., such that it generates less non-defect signal than the care areas used for programmed defect detection). For example, the logic block was found to also be substantially quiet in the selected mode with Fourier filtering. Any area in the die (preferably near the programmed defect cells just for the sake of convenience) that is not scattering or scatters similar to the defect cells can be used as the training care area.

In an additional embodiment, selecting the training care area includes determining which area on the wafer generates the non-defect signal closest to the lowest non-defect signal of the output generated for the one or more care areas with the selected one of the multiple modes. For example, ideally the training care area will have a background similar to the defect cells. Generally, it can be very difficult to find a similar background as defect cells. In other words, it can be substantially difficult to find a similar background as the defect cells somewhere else in the die. Making the programmed defect cell background substantially quiet is easier on laser scanning platforms (using Fourier filtering etc.). So it's convenient to make the defect cells quiet and find another quiet location. Therefore, the best option is to make the background in the defect cells substantially quiet using the hardware or software options. That's why the first step taken to make programmed defect detection work on laser scanning inspection tools with SDI was to modify the mode used for programmed defect detection. Now, since the defect cells are quiet, we can find a location with quiet background for SDI training. As such, if the background can be made quiet, then it could fall in array type SDI while making it easier to find an area having a quiet background (which is now the same as the defect cells) rather than the exact same "non-quiet" background. Within training care area 702, SDI training box 704 may be designated as the portion of the training care area that is actually used for SDI training. In this manner, the CAGs for SDI may be modified to include the training care area just for SDI training purposes.

In this manner, selecting the training care area as described herein is a kind of modification in SDI CAG just for training purposes. For example, after studying multiple wafer layers, the inventor figured out that most of the time when defects are located in relatively complex logic and/or I/O locations, the main challenge is simply to "pass" SDI training (to obtain a valid result that allows SDI training to be successfully completed). SDI training involves measuring some parameters (e.g., cell size) for its processing. It will be able to do that when the background is quiet, repeating in two dimensions, or repeating in one dimension thereby being categorized as array, horizontal, or vertical. So when the SDI training successfully measures the required parameters and the inspection areas fall into one of the 3 categories, the SDI training will pass. When it cannot measure the required parameters, then we say that SDI training has failed and it will also fail if the SDI type is determined to be random. When training fails, the SDI algorithm cannot be used. If a defect can be clearly seen in an image but we cannot figure out how to pass SDI training, then the CAG can be modified to include a substantially quiet site and to train SDI on the new location. By doing so, a valid training result for SDI with "array" type can be produced, and appropriate SDI thresholds can be determined.

In one embodiment, the training care area generates less of the non-defect signal than the one or more care areas used for detecting the programmed defects in the selected one of the multiple modes. For example, a logic block near the defect cells that is completely quiet in the new mode (e.g., NISPPP) may be included in the CAG of defect cells. Since the logic block is completely quiet in this mode, that means that the light scattered from the logic block will not include the non-defect signals from non-repeating patterned structures that are seen in the images of the programmed defect cells. Therefore, using such an area as the training care area means that the training care area will generate less of the non-defect signals than the care area(s) used for programmed defect detection. This new region is used for the sole purpose of SDI training. In other words, during inspection of the wafer, the inspection recipe will be set up in such a way that programmed defect detection is not performed in the training care area.

In another embodiment, the training care area does not include patterned features that cause the output generated in the training care area to contain non-defect signals that cannot be eliminated by Fourier filtering. For example, as described above, an area in the die that is completely quiet after Fourier filtering can be found (e.g., in a nearby logic block). This will be the case for areas that do not include non-repeating and/or random patterned features. In this manner, all of the non-defect signals can be removed by Fourier filtering. Since the mode selection is performed to make the output generated for the programmed defect cells completely quiet (or as near to completely quiet as possible), finding an area that does not include patterned features whose scattering cannot be eliminated by Fourier filtering will essentially ensure that that area is suitable for use as a training care area for the programmed defect cells because it will provide a training care area having substantially similar noise characteristics as the programmed defect cell. Therefore, selecting a training care area may include searching the design or the wafer for an area relatively near the programmed defect cells that includes only repeating features that can be Fourier filtered and then scanning the training care area in the selected mode to ensure that it does in fact generate substantially quiet background noise characteristics.

In another embodiment, selecting the training care area includes finding an area on the wafer that generates less of the non-defect signal than the one or more care areas and is located closest to the one or more care areas. The training care area does not necessarily need to be near the programmed defect cells. The training care area has to be drawn at a location different than the care area(s). If it is very far away from the programmed defect cells (in the y-direction), then it will increase the time needed for scanning the full wafer. If the training care area is closer to the care area(s), then an extra swath will not be required to scan the new training care area. Therefore, if there is a choice of multiple areas on the wafer that are suitable for use as the training care area, the area that is located closest to the programmed defect cells may be selected for use as the training care area.

In a further embodiment, the programmed defects are located in a first region in a die on the wafer, the training care area is located in a second region in the die, and the first and second regions have different types from each other. For example, as described above, the training care area does not need to be in any particular region in the die with respect to the programmed defects (although having the training care area relatively near the programmed defect cells can be somewhat beneficial for ease of scanning purposes). As long as the training care area has substantially similar noise characteristics, there is no restriction on the type of region in which it is located. In contrast, in currently used inspection processes, the training areas usually have to be in the same type of region as that in which the defects will be detected to ensure that the inspection can detect those defects. Instead, in the embodiments described herein, the training care area is mutually exclusive of the care area(s) and merely used as a stand in for the programmed defect cells in the training phase of the SDI method.

The computer subsystem(s) are further configured for training a programmed defect detection method using the output generated by the inspection subsystem with the selected one of the multiple modes in the training care area. For example, once one of the multiple modes and the training care area have been selected, the programmed defect detection method, e.g., SDI, may proceed with training as normal. The training may include setting any parameters of the programmed defect detection method that are alterable and/or need to be set in training. Those parameters may include, for example, cell size used in the defect detection, thresholds, and the like.

The computer subsystem(s) are also configured for detecting the programmed defects during the inspection of the wafer by applying the trained programmed defect detection method to the output generated in the one or more care areas by the inspection subsystem with the selected one of the multiple modes. The trained programmed defect detection method may be applied to the output generated in the one or more care areas in any suitable manner. In other words, once the programmed defect detection method has been trained, it can be applied to the output generated in the programmed defect cells as in any other defect detection method.

In one embodiment, the computer subsystem is configured for detecting the programmed defects during inspection of another wafer having the same type as the wafer by applying the trained programmed defect detection method to the output generated in the one or more care areas by the inspection subsystem with the selected one of the multiple modes. For example, in "optics tuning" (mode selection) with SDI, the best mode selection may be performed for every layer just for the programmed defect detection test. Every defect may produce different light scattering in the programmed defect cells. Similar to optics selection for DOI modes, selecting a mode of the inspection subsystem will include finding a mode with minimal non-defect scatter and at least some defect signal (i.e., a non-zero defect signal) because we are working with array type SDI. Therefore, the same mode can be used for other wafers of the same layer (where "layer" means a step in semiconductor processing). For example, if we setup this method on one layer, then all wafers of the same layer can be used with the selected optical mode. If we want to perform programmed defect detection on some other layer, then the mode selected for the first layer may or may not work for the new layer (a previously selected mode can be tested on a new layer to determine if it will work). However, the embodiments described herein can be used for any layer on a wafer, possibly with selecting a new optics mode and possibly a different training care area.

In some embodiments, the system includes a defect review system configured for re-detecting the programmed defects and determining the locations of non-programmed defects detected on the wafer in the inspection of the wafer based on locations of the re-detected programmed defects determined by the defect review system, locations of the programmed defects detected by the computer subsystem during the inspection of the wafer, and locations of the non-programmed defects detected by the computer subsystem during the inspection of the wafer. For example, as shown in FIG. 1, the system may include defect review system 124, which may include a SEM or any other suitable defect review system. The defect review system may be a part of the system by being coupled to one or more elements of the system. For example, although not shown in FIG. 1, a computer subsystem or a storage medium of the defect review system may be coupled to a computer subsystem or a storage medium of the system. The defect review system also may or may not share one or more elements with the other components of the system. The shared one or more elements (not shown) may include, for example, a shared power source, a shared housing, a shared stage, and/or a shared loading module. The defect review system may include any suitable commercially available defect review system such as the eDR family of tools commercially available from KLA-Tencor.

Once the programmed defects have been re-detected by the defect review system, which may be performed as with any other defect re-detection, the locations of the re-detected programmed defects can be determined. The coordinates of the programmed defects determined by the defect review system and the coordinates of the programmed defects determined by inspection may be used to determine a relationship (e.g., a transformation) between the different programmed defect coordinates. That relationship may then be used to determine the locations of any other defects in the defect review system coordinates. For example, if the relationship is a transformation, that transformation may be applied to the defect coordinates determined by inspection to thereby identify where the defects are located with respect to the defect review system thereby effectively de-skewing the defects in the defect review system. The programmed defects and their coordinates determined by the defect review system may be used to perform defect de-skew for each die in which defects are being reviewed. The programmed defects and their coordinates determined by the defect review system may also be used to provide substantially accurate de-skewed defect coordinates thereby enabling substantially accurate defect re-detection even with a substantially small field of view (FOV), e.g., about 1 micron, on the defect review system.

The embodiments described herein, therefore, provide a number of advantages over previously available programmed defect detection methods. For example, optics tuning with SDI and modification in CAG for SDI training are the two new, most important features of the embodiments described herein. While these options have been available on optical inspection tools, they were not meant to be used with SDI methods before. With the new approaches described herein, a completely new domain for SDI applications is opened. In particular, previously, SDI was limited to the array region or patterns with repeating structures. However, with the "optics tuning" (mode selection) and "modification in CAD for SDI training" (training care area selection) described herein, SDI can be used in regions with non-repeating random logic patterns. With the above mentioned methods, the inventor has discovered a way to apply SDI methods to any use case.

Each of the embodiments of each of the systems described above may be combined together into one single embodiment.

Another embodiment relates to a computer-implemented method for detecting programmed defects on a wafer during inspection of the wafer. The method includes the steps described above. Each of the steps of the method may be performed as described further herein. The method may also include any other step(s) that can be performed by the inspection subsystem, computer subsystem(s), or system(s) described herein. The steps are performed by one or more computer systems, which may be configured according to any of the embodiments described herein. In addition, the method described above may be performed by any of the system embodiments described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. For example, as described further herein, the results of detecting the programmed defects on the wafer during inspection of the wafer may be used for correcting positions of defects re-detected during defect review.

Figure 8:
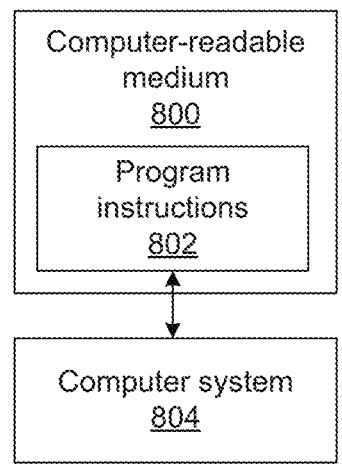
FIG. 8 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for detecting programmed defects on a wafer during inspection of the wafer. One such embodiment is shown in FIG. 8. In particular, as shown in FIG. 8, non-transitory computer-readable medium 800 includes program instructions 802 executable on computer system 804. The computer-implemented method may include any step(s) of any method(s) described herein.

Program instructions 802 implementing methods such as those described herein may be stored on computer-readable medium 800. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 804 may be configured according to any of the embodiments described herein.

Further modifications and alternative embodiments of various aspects of the invention will be apparent to those skilled in the art in view of this description. For example, systems and methods for detecting programmed defects on a wafer during inspection of the wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to detect programmed defects on a wafer during inspection of the wafer, comprising:
   an inspection subsystem configured for generating output for a wafer by scanning the wafer with light and detecting light scattered from the wafer during the scanning, wherein the inspection subsystem is further configured for generating the output with multiple modes defined by different values of at least one parameter of the inspection subsystem used for generating the output; and
   a computer subsystem configured for:
      selecting one of the multiple modes of the inspection subsystem for detecting programmed defects on the wafer by determining which of the multiple modes generates the output for the wafer having the lowest non-defect signal and at least a minimum signal for the programmed defects;
      selecting a training care area, wherein the training care area is mutually exclusive of one or more care areas used for detecting the programmed defects during inspection of the wafer, and wherein the training care area generates less of the non-defect signal than the one or more care areas used for detecting the programmed defects;
      training a programmed defect detection method using the output generated by the inspection subsystem with the selected one of the multiple modes in the training care area; and
      detecting the programmed defects during the inspection of the wafer by applying the trained programmed defect detection method to the output generated in the one or more care areas by the inspection subsystem with the selected one of the multiple modes.

2. The system of claim 1, wherein selecting the one of the multiple modes comprises generating the output for the wafer in only one or more cells in which the programmed defects are located, and wherein determining which of the multiple modes generates the output for the wafer having the lowest non-defect signal and at least the minimum signal for the programmed defects is performed based on only the output generated in only the one or more cells in which the programmed defects are located.

3. The system of claim 1, wherein the programmed defect detection method comprises a single die inspection method.

4. The system of claim 1, wherein the programmed defects comprise die repeater defects in a region of a die on the wafer, and wherein the region comprises non-repeating logic patterned features.

5. The system of claim 1, wherein the training care area generates less of the non-defect signal than the one or more care areas used for detecting the programmed defects in the selected one of the multiple modes.

6. The system of claim 1, wherein the training care area does not comprise patterned features that cause the output generated in the training care area to contain non-defect signals that cannot be eliminated by Fourier filtering.

7. The system of claim 1, wherein the programmed defects are located in a region of a die on the wafer, and wherein the region comprises patterned features that cause the output generated in the one or more care areas to contain non-defect signals that cannot be eliminated by Fourier filtering.

8. The system of claim 7, wherein the programmed defect detection method comprises a single die inspection method, and wherein a size of an area in the region that does not generate the non-defect signals is smaller than a minimum, predetermined size of an area required for training the single die inspection method.

9. The system of claim 1, wherein the programmed defects are located in different defect cells, respectively, and wherein a size of the different defect cells is smaller than a minimum, predetermined size of an area required for training the programmed defect defection method thereby preventing any of the different defect cells from being used as the training care area.

10. The system of claim 1, wherein selecting the training care area is performed based on the output generated by the inspection subsystem using the selected one of the multiple modes.

11. The system of claim 1, wherein selecting the training care area comprises finding an area on the wafer that generates less of the non-defect signal than the one or more care areas and is located closest to the one or more care areas.

12. The system of claim 1, wherein selecting the training care area comprises determining which area on the wafer generates the non-defect signal closest to the lowest non-defect signal of the output generated for the one or more care areas with the selected one of the multiple modes.

13. The system of claim 1, wherein the programmed defects are located in an input/output region in a die formed on the wafer.

14. The system of claim 1, wherein the programmed defects are located in a first region in a die on the wafer, wherein the training care area is located in a second region in the die, and wherein the first and second regions have different types from each other.

15. The system of claim 1, wherein each of the one or more care areas comprises multiple defect cells, and wherein each of the multiple defect cells comprises at least one of the programmed defects.

16. The system of claim 1, wherein the inspection of the wafer comprises detecting non-programmed defects on the wafer, and wherein the output generated by the inspection subsystem used for detecting the non-programmed defects on the wafer comprises output generated for the wafer by the inspection subsystem with another of the multiple modes different from the selected one of the multiple modes.

17. The system of claim 1, wherein the computer subsystem is further configured for detecting the programmed defects during inspection of another wafer having the same type as the wafer by applying the trained programmed defect detection method to the output generated in the one or more care areas by the inspection subsystem with the selected one of the multiple modes.

18. The system of claim 1, wherein the inspection subsystem comprises a laser configured to generate the light used for scanning the wafer.

19. The system of claim 1, further comprising a defect review system configured for re-detecting the programmed defects and determining the locations of non-programmed defects detected on the wafer in the inspection of the wafer based on locations of the re-detected programmed defects determined by the defect review system, locations of the programmed defects detected by the computer subsystem during the inspection of the wafer, and locations of the non-programmed defects detected by the computer subsystem during the inspection of the wafer.

20. A non-transitory computer-readable medium, storing program instructions executable on a computer system for performing a computer-implemented method for detecting programmed defects on a wafer during inspection of the wafer, wherein the computer-implemented method comprises:

selecting one of multiple modes of an inspection subsystem for detecting programmed defects on a wafer, wherein the inspection subsystem is configured for generating output for the wafer by scanning the wafer with light and detecting light scattered from the wafer during the scanning, wherein the inspection subsystem is further configured for generating the output with the multiple modes defined by different values of at least one parameter of the inspection subsystem used for generating the output, and wherein selecting the one of the multiple modes comprises determining which of the multiple modes generates the output for the wafer having the lowest non-defect signal and at least a minimum signal for the programmed defects;

selecting a training care area, wherein the training care area is mutually exclusive of one or more care areas used for detecting the programmed defects during inspection of the wafer, and wherein the training care area generates less of the non-defect signal than the one or more care areas used for detecting the programmed defects;

training a programmed defect detection method using the output generated by the inspection subsystem with the selected one of the multiple modes in the training care area; and detecting the programmed defects during the inspection of the wafer by applying the trained programmed defect detection method to the output generated in the one or more care areas by the inspection subsystem with the selected one of the multiple modes, wherein selecting the one of the multiple modes, selecting the training care area, training the programmed defect detection method, and detecting the programmed defects are performed by the computer system.

21. A method for detecting programmed defects on a wafer during inspection of the wafer, comprising:

selecting one of multiple modes of an inspection subsystem for detecting programmed defects on a wafer, wherein the inspection subsystem is configured for generating output for the wafer by scanning the wafer with light and detecting light scattered from the wafer during the scanning, wherein the inspection subsystem is further configured for generating the output with the multiple modes defined by different values of at least one parameter of the inspection subsystem used for generating the output, and wherein selecting the one of the multiple modes comprises determining which of the multiple modes generates the output for the wafer having the lowest non-defect signal and at least a minimum signal for the programmed defects;

selecting a training care area, wherein the training care area is mutually exclusive of one or more care areas used for detecting the programmed defects during inspection of the wafer, and wherein the training care area generates less of the non-defect signal than the one or more care areas used for detecting the programmed defects;

training a programmed defect detection method using the output generated by the inspection subsystem with the selected one of the multiple modes in the training care area; and detecting the programmed defects during the inspection of the wafer by applying the trained programmed defect detection method to the output generated in the one or more care areas by the inspection subsystem with the selected one of the multiple modes, wherein selecting the one of the multiple modes, selecting the training care area, training the programmed defect detection method, and detecting the programmed defects are performed by one or more computer systems.

* * * * *